United States Patent [19]
Bryan et al.

[11] Patent Number: 6,121,804
[45] Date of Patent: Sep. 19, 2000

[54] HIGH FREQUENCY CMOS CLOCK RECOVERY CIRCUIT

[75] Inventors: Thomas Clark Bryan; Allen Carl Merrill, both of Encinitas; Wei Fu, San Diego, all of Calif.

[73] Assignee: Applied Micro Circuits Corporation, San Diego, Calif.

[21] Appl. No.: 09/140,840

[22] Filed: Aug. 27, 1998

[51] Int. Cl.$^7$ ...................................................... H03L 7/00
[52] U.S. Cl. ........................... 327/144; 327/155; 327/166
[58] Field of Search ..................... 327/144, 155, 327/165, 166, 172, 176, 291, 292, 293, 294, 299

[56] References Cited

U.S. PATENT DOCUMENTS

| | | | |
|---|---|---|---|
| 4,535,459 | 8/1985 | Hogge, Jr. ................................. | 375/80 |
| 5,619,171 | 4/1997 | Rijckaert et al. ....................... | 331/1 A |
| 5,770,976 | 6/1998 | Nagaraj .................................... | 331/1 A |
| 5,799,048 | 8/1998 | Farjad-Rad et al. .................... | 375/360 |

OTHER PUBLICATIONS

C. Hogge, Jr., "A Self Correcting Clock Recovery Circuit," J. of Lightwave Technology, vol. LT–3, No. 6, Dec. 1985.

M. Park et al., "Novel Regenerator Having Simple Clock Entration and Automatic Phase–Controlled Retiming Circuit," Journal is unknown, Jul., 1988; Authors from Optical Communications Section, Electronics & Telecommunications Research Institute, Chungnam, Korea.

T. Wong et al., "A 10Gb/s ATM Data Synchronizer," IEEE J. of Solid–State Circuits, vol. 31, No. 10, Oct. 1996.

*Primary Examiner*—Jeffrey Zweizig
*Attorney, Agent, or Firm*—Gray Cary Ware Freidenrich

[57] ABSTRACT

A complementary metal-oxide semiconductor (CMOS) integrated circuit that includes a clock recovery circuit. The clock recovery circuit automatically properly aligns a clock with data. A latch is used to perform the function of a flip-flop. Because the flip flop is essentially two latches, using the latch rather than the flip flop results in a circuit having one less latch. Consequently, the circuit has less propagation delay, which permits higher frequency operation. Use of the latch also reduces the load on the clock and saves power. Additionally, the clock recovery circuit uses differential logic, which decreases noise sensitivity and allows higher frequency operation.

16 Claims, 4 Drawing Sheets

HIGH FREQUENCY CMOS CLOCK RECOVERY CIRCUIT

CROSS-REFERENCE TO RELATED APPLICATIONS

Not Applicable

STATEMENT REGARDING FEDERALLY SPONSORED RESEARCH OR DEVELOPMENT

Not applicable

REFERENCE TO A MICROFICHE APPENDIX

Not applicable

BACKGROUND OF THE INVENTION

1. Field of the Invention

The present invention relates to a CMOS clock recovery circuit for integrated circuit applications. More particularly, the invention concerns a CMOS clock recovery circuit that establishes and maintains proper alignment between data and clock signals at high frequencies.

2. Description of the Related Art

Metal-oxide semiconductor (MOS) technology is virtually the standard for digital circuits that are used for telecommunications, datacommunications, and computers. Increasingly, CMOS (complementary MOS) technology is used in these applications. CMOS technology incorporates both n-channel MOS and p-channel MOS transistors in the same monolithic structure. High speed and low power consumption are often desired in CMOS circuits in many applications.

In high speed CMOS circuits, there is often a need to maintain proper alignment between input data and the clock, which are also referred to as input data signals and clock signals. It is known that proper alignment between data and the clock can be achieved by temporarily either speeding up or slowing down the clock. "A Self Correcting Clock Recovery Circuit", *Journal of Lightwave Technology*, Vol. Lt-3, No. 6, December 1985, by Charles R. Hogge, Jr., which is incorporated herein by reference, discloses circuits, referred to as "clock recovery circuits", for automatically maintaining a desired alignment between input data and the clock, by automatically adjusting the voltage connected to the input of a voltage controlled oscillator, which outputs the clock signal.

Figure 1:
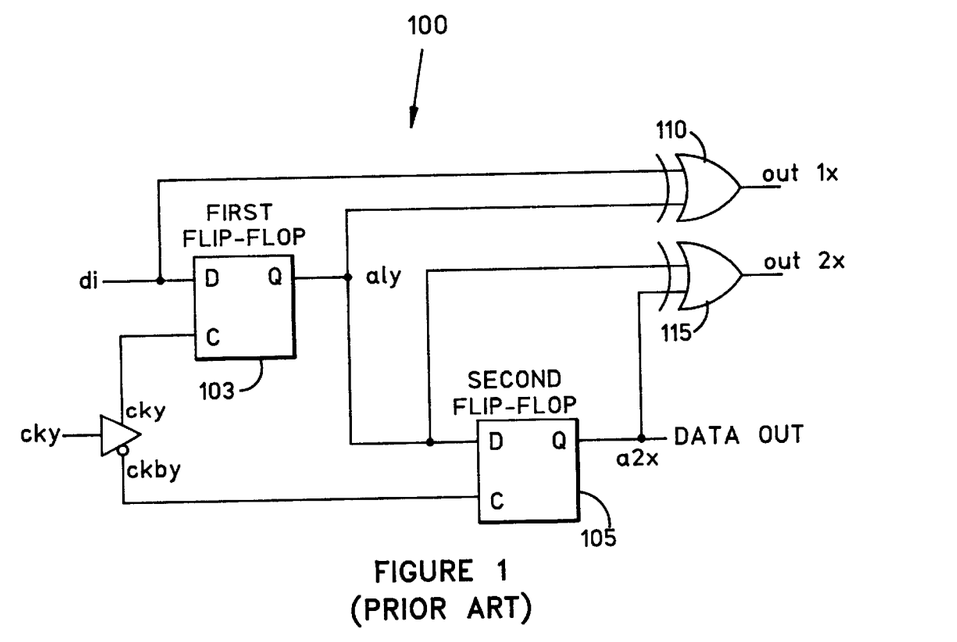
FIG. 1 is a block diagram of a circuit depicting a portion of the prior art clock recovery circuit disclosed by Hogge.
Figure 7:
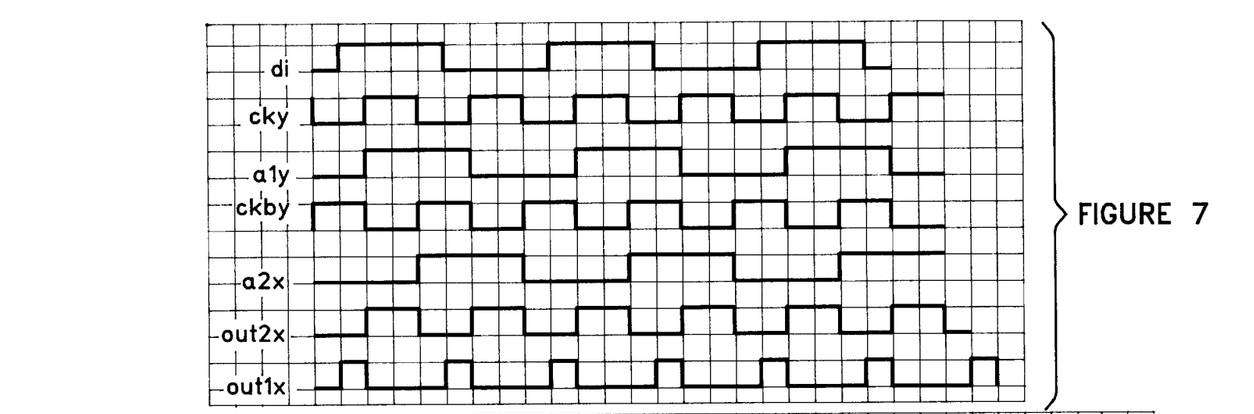
FIG. 7 is a timing diagram depicting idealized performance of the circuits of FIGS. 1 and 5.

FIG. 1 illustrates pertinent portions of a clock recovery circuit 100 disclosed by Hogge. FIG. 7 is an idealized timing diagram that illustrates the operation of the circuit of FIG. 1, but without indicating the effects of propagation delays and other similar delays. Data di and clock cky are inputted into a first flip flop 103. The output of the first flip flop is a1y, which is a delayed version of di. a1y and not-clock ckby are inputted into a second flip flop 105. The output of the second flip flop is a2x, which is a further delayed version of di. Data di and the output of the first flip flop a1y are inputted into a first exclusive-or (x-or) gate 110, and the output of the first flip flop a1y and the output of the second flip flop a2x are inputted into a second x-or gate 115.

The output 1x from the first x-or gate is a stream of variable width pulses, with the leading edges of the pulses coinciding with each positive and negative transition of the data di. The width of each output pulse 1x is determined by the position of the clock pulses cky relative to the data pulses di. The output from the second x-or gate is a stream of fixed width pulses 2x having 50% duty cycles, with the leading edges of these pulses coinciding with the trailing edges of the output pulses 1x from the output of the first x-or gate.

It is desired to have the transitions of the data pulses di coincide with the trailing edges of the clock pulses cky and the leading edges of the not-clock pulses ckby. If the trailing edges of the clock pulses cky are to the left of the transitions of the data, then the pulses cky and ckby are advanced relative to the data, as is the case in FIG. 7. When the clock pulses are advanced, the width of the pulses 1x from the output of the first x-or gate is reduced to less than a 50% duty cycle, with the extent of the reduction of the width of the pulses being proportional to the extent that the clock is advanced relative to the data. If the trailing edges of the clock pulses cky are to the right of the transitions of the data, then the pulses cky and ckby are retarded relative to the data. When the clock is retarded, the width of the pulses 1x from the output of the first x-or gate is increased to greater than a 50% duty cycle, with the extent of the increase in the width of the pulses being proportional to the extent that the clock is retarded relative to the data. When the clock has the desired alignment with the data, the width of the variable width pulses 1x from the output of the first x-or gate is identical to the width of the fixed width pulses 2x from the output of the second x-or gate, except for jitter errors.

With additional circuitry not shown in FIG. 1, the average of the output of the second x-or gate is subtracted from the average of the output of the first x-or gate to produce a difference signal that is used to control the frequency of a voltage controlled oscillator (VCO). The output of the oscillator is the clock cky. Thus, the circuit automatically varies the frequency of the VCO in order to establish and maintain the desired alignment between the clock and the data.

Figures 3, 4:
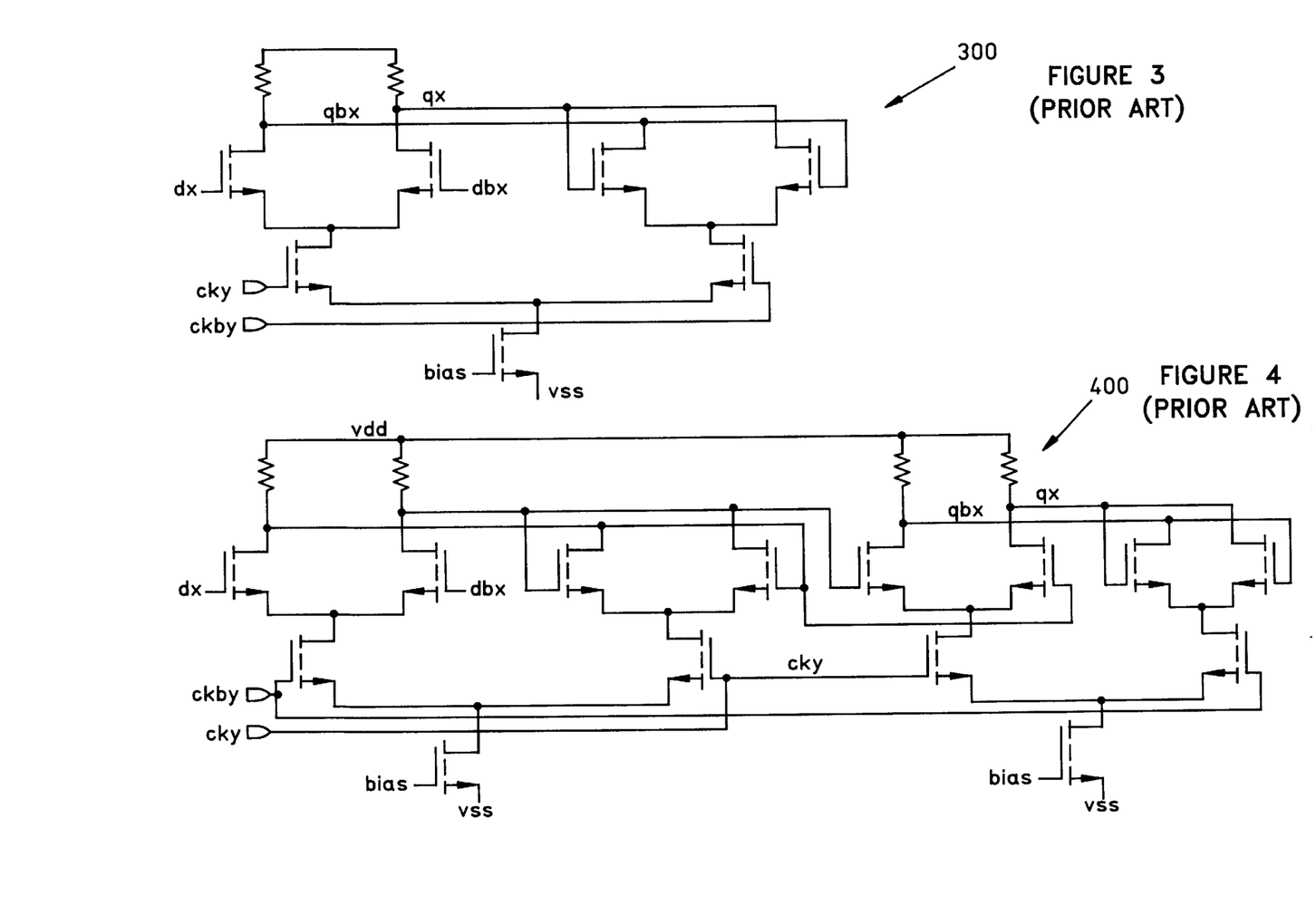
FIG. 3 is a schematic diagram of a representative CMOS differential latch.
FIG. 4 is a schematic diagram of a representative CMOS differential flip-flop.

FIG. 3 is a schematic diagram of a CMOS differential latch 300. FIG. 4 is a schematic diagram of a CMOS differential flip flop 400. This discussion applies to single-ended, as well as differential, latches and flip flops. It can be seen that the flip flop is essentially two interconnected latches, which can be referred to as a master latch and a slave latch. Because this type of flip flop consists of a master latch and a slave latch, this flip flop can be referred to as a master-slave flip flop.

Figure 2:
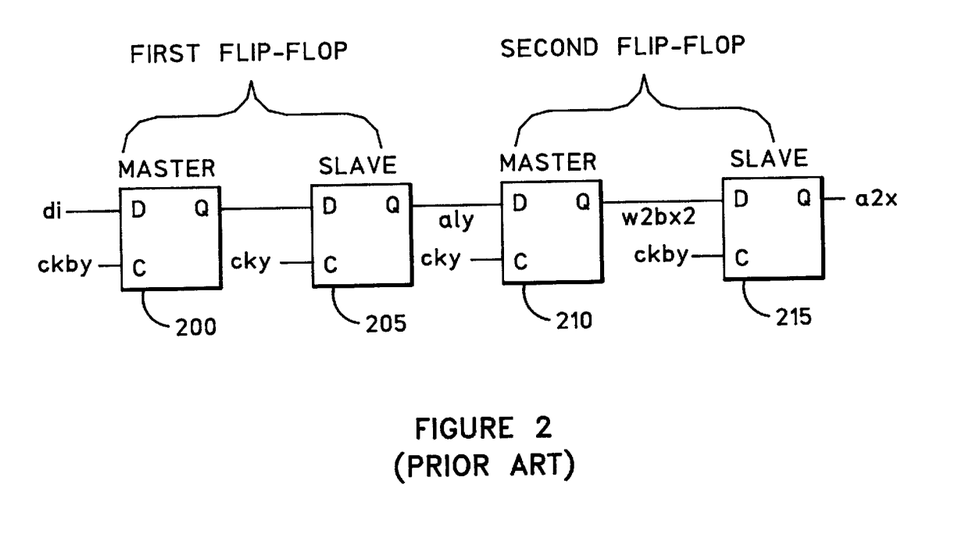
FIG. 2 is a block diagram illustrating the latches in the prior art circuit of FIG. 1.
Figure 8:
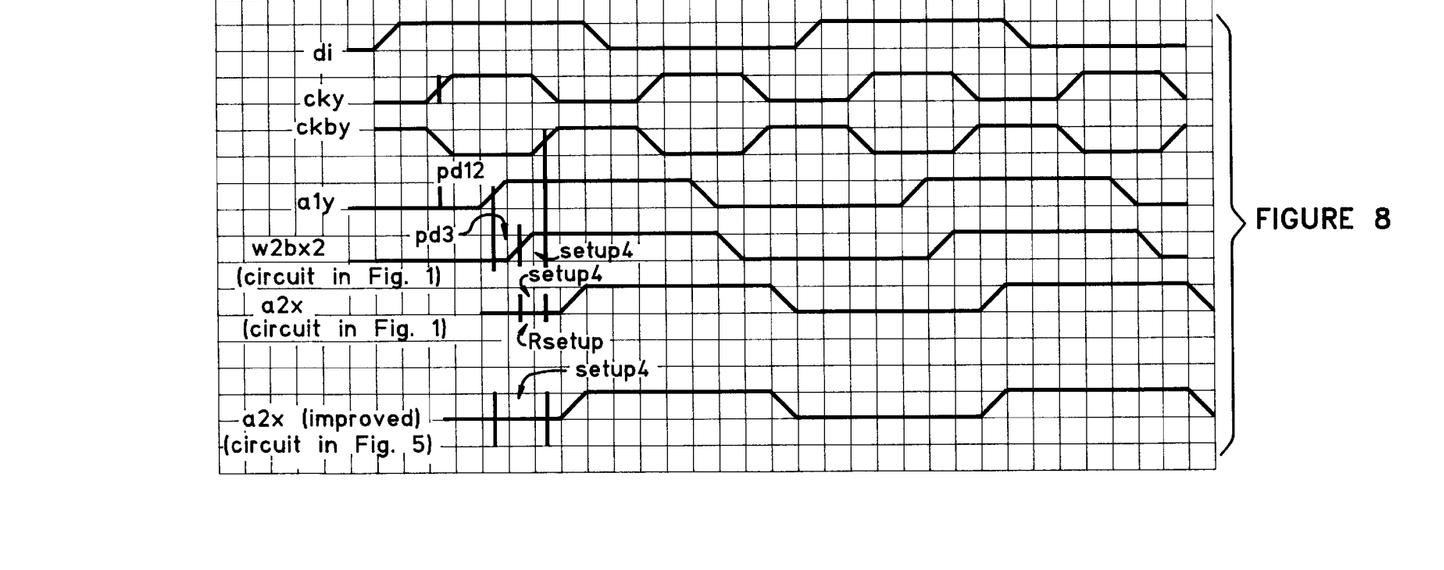
FIG. 8 is a timing diagram depicting the actual performance of the circuits of FIGS. 1 and 5.

As illustrated in FIG. 2, the first flip flop 103 of the circuit 100 of FIG. 1 consists of first master latch 200 and first slave latch 205, and the second flip flop 105 consists of second master latch 210 and second slave latch 215. As can be seen in FIG. 8, when clock cky goes from low to high, the output a1y of the first slave latch, which is the output of the first flip flop, does not change until after the "clock to Q" delay through the first master latch and the first slave latch, referred to as ck→Q. FIG. 8 also shows that when the clock cky is high, the output w2bx2 of the second master latch 210 does not change when the input a1y to the second master latch changes until after the propagation delay through the second master latch, referred to as pd3. When the not-clock pulse ckby goes from low to high, the output of the second master latch w2bx2 is transferred to the output of the second slave latch. The signal output of the second slave latch is designated a2x. In order for the signal w2bx2 at the input of the second slave latch to be accurately transferred to the output of the second slave latch when ckby goes from low to high, the signal w2bx2 must have been present at the input to the second slave latch a minimum period of time, referred to as the required setup time Rsetup for the second slave latch. The actual setup time, which is referred to as setup4, is the time between the end of the propagation delay pd3 and the instant that ckby switches from low to high. If setup4 is less than Rsetup, w2bx2 may not be accurately transferred to the output of the second slave latch.

To summarize, when cky goes from low to high, the signal at the input to the first master latch, which is the input to the first flip flop, will be transferred to the output of the first slave latch, which is the output of the first flip flop, after a delay of ck→Q which is the delay through the first flip flop. Also, when the clock cky is high, the signal a1y at the input to the second master latch will be transferred to the output of the second master latch, after the propagation delay through the second master latch pd3. The signal w2bx2 at the output of the second master latch must be present for at least the required setup time Rsetup, in order for the signal w2bx2 to be accurately transferred to the output of the second slave latch when ckby goes from low to high. Thus, in order for the data to be accurately transferred from the input of the first flip flop to the output of the second flip flop so that the circuit will function properly, the time between when the clock cky goes from low to high and when the not-clock ckby goes from low to high must be a minimum of ck→Q+pd3+Rsetup. It follows that the maximum frequency of operation for this circuit is approximately:

$$\frac{1}{2}(ck{\rightarrow}Q+pd3+Rsetup).$$

The values of ck→Q, pd3, and Rsetup, are functions of the integrated circuit (IC) fabrication process used, and consequently, the maximum frequency of operation of the circuit of FIG. 1 is also a function of the fabrication process. For example, with a 0.35 micron process, the maximum frequency of operation of the circuit of FIG. 1 is approximately 2.0 gigahertz (GHz).

Due to the increased costs of manufacturing IC's with smaller geometry processes that allow higher frequency operation, there is a desire to operate circuits manufactured with a particular process at higher frequencies. However, for any given fabrication process, the maximum frequency of operation of the circuit of FIG. 1 is limited due to the fact that there are two delays, ck→Q and pd3, in addition to the required setup time Rsetup. Another shortcoming of the circuit of FIG. 1 is that there are four latches loading the clock and consuming power.

Hogge discloses an additional clock recovery circuit that uses a delay line instead of the second flip flop 105. The delay line cannot be implemented in a monolithic integrated circuit (IC), and is typically implemented as a microstrip circuit on a ceramic substrate. Due to the fact that the delay line cannot be included in the IC, use of a delay line is undesirable for several reasons. First, using a delay line is more expensive than a circuit that is implemented entirely on a monolithic IC, due to the cost of the delay line which is an additional component. Second, the delay line requires additional space because it is not part of the IC. And third, the delay line can be subject manufacturing variations independent of the IC.

Consequently, there is a need for a low power CMOS circuit that can be implemented on a monolithic IC, that establishes and maintains proper alignment between data and the clock at frequencies higher than the maximum frequency of operation of the circuit of FIG. 1 for any given IC manufacturing process.

SUMMARY OF THE INVENTION

Broadly, the present invention concerns a complementary metal-oxide semiconductor (CMOS) clock recovery circuit (CRC) for synchronizing a clock with data at high frequencies. The high frequency CRC will typically be implemented as part of one of several circuits of a CMOS integrated circuit. Alternatively, the CRC can be implemented as discrete component.

One important aspect of the invention is based on the discovery that, in the clock recovery circuit disclosed by Hogge, if the second flip-flop is replaced with a single latch, the latch produces an output that is the same as the output that would have been produced by the flip-flop. This result contrasts with the general case where, if the same data and clock signals are inputted into a latch and a flip-flop, the output of the latch will not always be the same as the output of the flip-flop. Because the flip flop is essentially two latches, replacing the flip flop with a latch eliminates a latch from the circuit, thereby rendering a simpler circuit having three latches rather than four latches. Elimination of one of the latches eliminates the propagation delay associated with that latch, which allows higher frequency operation. Higher frequency operation is also facilitated by the reduced loading of the clock resulting from the elimination of the latch. Also, due to the reduced number of components, elimination of the latch results in less power consumption and heat generation.

Although the invention can be implemented with single-ended logic, in a preferred embodiment, the clock recovery circuit uses differential logic, which entails using noninverted and inverted data pairs in the digital portions of the circuit. The use of differential logic results in less noise sensitivity, which permits using lower voltage swings. Using lower voltage swings allows higher frequency operation.

Compared to clock recovery circuits that use external delay lines, the invention also has the advantages of lower cost, smaller size, and less manufacturing variations. The present invention also provides other advantages and benefits, which are apparent from the following description.

BRIEF DESCRIPTION OF THE DRAWINGS

The nature, objects, and advantages of the invention will become more apparent to those skilled in the art after considering the following detailed description in connection with the accompanying drawings, in which like reference numerals designate like parts throughout, wherein.

DETAILED DESCRIPTION OF THE PREFERRED EMBODIMENTS

The present invention concerns a complementary metal-oxide semiconductor (CMOS) high frequency clock recovery circuit (CRC) for establishing and maintaining a desired alignment between clock signals and data signals. The CRC of the invention automatically aligns the trailing edges of the clock pulses cky with the transitions of the data pulses. Equivalently, the CRC aligns the leading edges of the not-clock pulses ckby with the transitions of the data pulses.

Figure 5:
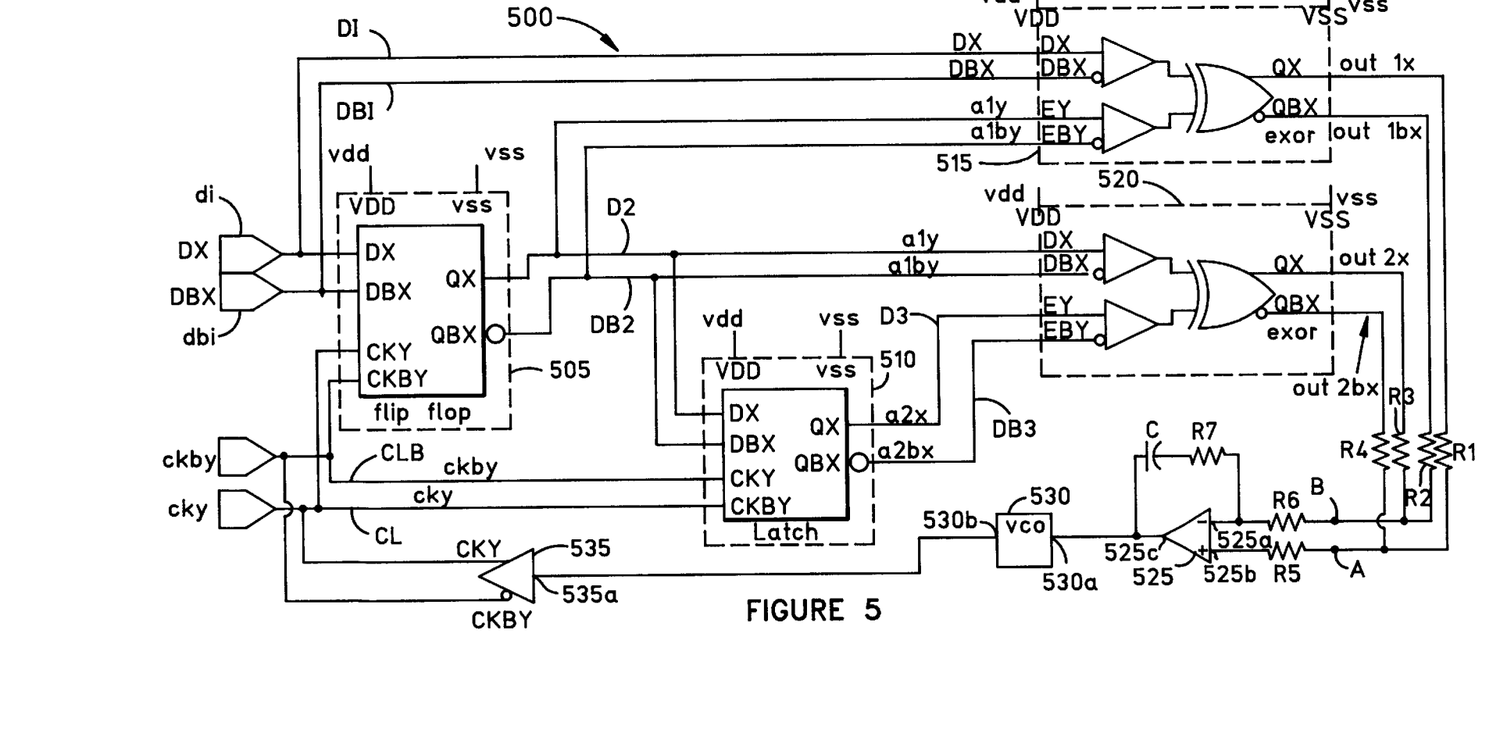
FIG. 5 is a block diagram of a CMOS high speed clock recovery circuit according to one illustrative embodiment of the invention.

An illustrative embodiment of the CMOS CRC 500 of the invention is illustrated in FIG. 5. In the CRC 500 of FIG. 5, a latch 510 is used rather than the second flip flop 105 used in the circuit 100 in FIG. 1. The prior art circuit 100 in FIG. 1 is discussed in the background section above. Using the latch 510 instead of the flip flop 105 eliminates the second master latch 210 shown in FIG. 2, and consequently eliminates the propagation delay pd3 through the second master latch 210, which allows higher frequency operation. Eliminating the second master latch 210 also reduces the loading on the clock, and reduces power consumption. Also, differential logic is used in the CRC 500 of FIG. 5, which increases noise immunity. This permits the use of smaller voltage swings, which allows higher frequency operation. These features and other important aspects of the CRC 500 will now be discussed.

Hardware Components and Interconnections

The hardware components and interconnections of the high frequency CRC 500 are illustrated in FIG. 5.

The CRC 500 includes a flip flop 505. The flip flop has a pair of differential data inputs which are, data input DX and not-data input DBX. The flip flop also has a pair of differential clock inputs which are, clock input CKY and not-clock input CKBY. The flip flop also has a pair of differential outputs which are, output QX and not-output QBX. The flip flop also includes VDD and VSS connectors for connection to supply voltages vdd and vss.

Not-data signals are the logical compliment, or equivalently the inverse, of data signals. Similarly, not-clock signals are the logical compliment of clock signals, and not-output signals are the logical compliment of output signals. For example, when data is high, not-data is low, and vice-versa. Data signals may also be referred to as data, and clock signals may also be referred to as clock. The clock signals and not-clock signals may individually or together be referred to as the clock, and can also be referred to as a differential clock pair.

The CRC 500 also includes a latch 510. The latch has a pair of differential data inputs which are, data input DX and not-data input DBX. The latch also has a pair of differential clock inputs which are, clock input CKY and not-clock input CKBY. The latch also has a pair of differential outputs which are, output QX and not-output QBX. The latch also includes VDD and VSS connectors for connection to supply voltages vdd and vss.

The CRC 500 also includes a first exclusive-or (x-or) gate 515, and a second x-or gate 520. The first x-or gate has a pair of differential inputs, data inputs DX and not-data inputs DBX, which together are the first input to the first x-or gate. The first x-or gate also has another pair of differential inputs, data inputs EY and not-data inputs EBY, which together are the second input to the first x-or gate. Similarly, the second x-or gate has a pair of differential inputs, data inputs DX and not-data inputs DBX, which together are the first input to the second x-or gate. The second x-or gate also has another pair of differential inputs, data inputs EY and not-data inputs EBY, which together are the second input to the second x-or gate. Each x-or gate also includes VDD and VSS connectors for connection to supply voltages vdd and vss.

A voltage vdd is connected to the VDD connectors, and a voltage vss is connected to the VSS connectors. The voltages vdd and vss can be any voltages used for CMOS circuits. The voltages used are a function of the IC fabrication process. For example, with a 0.35 micron process, preferably the voltage difference between vdd and vss is about 3.3 volts. Smaller voltage differences are possible, and are in fact required, by smaller geometry processes. Typically, vss is ground.

The circuit 500 includes differential data inputs, which are data input DX and not-data input DBX. Non-inverted data di is inputted into data input DX, and inverted data dbi is inputted into not-data input DBX. These inputs are connected respectively to data lines D1 and DB1, which are connected to the data inputs DX and DBX of the flip flop and to the respective data inputs DX and DBX of the first x-or gate.

Data line D2 connects the non-inverting output QX of the flip flop to the non-inverting input EY of the first x-or gate, and to the non-inverting input DX of the second x-or gate, and to the non-inverting input DX of the latch. Similarly, data line DB2 connects the inverting output QBX of the flip flop to the inverting input EBY of the first x-or gate, and to the inverting input DBX of the second x-or gate, and to the inverting input DBX of the latch.

Data line D3 connects the non-inverting output of the latch to the non-inverting input EY of the second x-or gate. Likewise, data line DB3 connects the inverting output of the latch QBX to the inverting input EBY of the second x-or gate.

The non-inverting output QX of the first x-or gate 515, the inverting output QBX of the first x-or gate, the non-inverting output QX of the second x-or gate 520, and the inverting output QBX of the second x-or gate are connected respectively to one end of resistors R1, R2, R3, and R4. The other ends of resistors R1 and R4 are connected to node A. Resistor R5 connects node A to the non-inverting input 525b of operational amplifier (op-amp) 525. The ends of resistors R2 and R3 that are not connected to the outputs of the x-or gates are connected to node B. Resistor R6 connects node B to the inverting input 525a of op-amp 525.

A feedback loop connects the output 525c of the op-amp to the inverting input 525a of the op-amp. The feedback loop consists of the series combination of capacitor C and resistor R7.

The signal at the output of the op-amp is representative of the difference between the average voltage of the output QX of the first x-or gate and the average voltage of the output QX of the second x-or gate, and is also representative of the difference between the average voltage of the output QBX of the first x-or gate and the average voltage of the output QBX of the second x-or gate. Accordingly, the output of the op-amp is referred to as a difference signal. If the CRC is not implemented with differential logic, then each of the x-or gates will have a single output, and the output of the op-amp will simply be representative of the difference between the average voltage of the output of the first x-or gate and the average voltage of the output of the second x-or gate.

Rather than using an op-amp, other means could be employed for producing the difference signal. For example, digital circuitry, such as adders or counters and a digital to analog converter could be used to produce the difference signal.

The output of the op-amp is connected to the input 530a of a voltage controlled oscillator (VCO) 530. The output 530b of the VCO is connected to the input 535a of a buffer/inverter 535. The non-inverting output CKY of the buffer/inverter outputs the clock signal cky, and the inverting output CKBY of the buffer/inverter outputs the not-clock signal ckby. The buffer/inverter is not necessary if the VCO has non-inverting and inverting outputs, in which case the output of the non-inverting output of the VCO would be the clock signal cky and the output of the inverting output of the VCO would be the not-clock signal ckby. Also, only an inverter is required if the output of the VCO is used for the clock signal cky, and if cky is inverted to produce the not-clock signal ckby. The buffer/inverter is also not necessary if the CRC is implemented with single-ended logic rather than differential logic, in which case the output of the VCO is the clock signal cky. If the CRC is implemented with single-ended logic, then the clock signal cky is connected to the clock input of the flip flop, and the clock signal cky is passed through an inverter to produce the not-clock signal ckby, which is connected to the clock input of the latch. Additionally, it is possible for the flip flop and/or the latch to have an inverting clock input that inverts the clock signal applied to the input, which can eliminate the need for producing a not-clock signal. In any case, the output of the VCO will be at the clock frequency and can be referred to as the clock. Also, in any implementation, the clock signal cky and/or the not-clock signal ckby can be connected to circuitry external to the CRC.

The maximum frequency of the output of the VCO is a function of the IC fabrication process used, and is higher for smaller geometry processes. For any given fabrication process, the CRC of the invention is capable of operation at higher frequencies than the prior art circuit 100 of FIG. 1. For example, for a 0.35 micron process, the CRC of the invention is capable of operation at frequencies up to at least about 2.7 GHz, whereas the circuit 100 of FIG. 1 is capable of operation at frequencies up to only about 2.0 GHz. Thus, for a 0.35 micron process, the maximum frequency is about 35% higher with the CRC of the invention.

Clock bus CL connects the non-inverting output CKY of the buffer/inverter to the non-inverting clock input of the first flip flop, and to the inverting clock input CKBY of the latch. Similarly, clock bus CLB connects the inverting output CKBY of the buffer/inverter to the inverting clock input CKBY of the flip flop, and to the non-inverting clock input CKY of the latch.

Preferably, the CRC of the invention is implemented with differential logic. Differential logic is less sensitive to noise than non-differential logic. Using differential logic permits using lower voltage swings, which allows higher frequency operation. In an alternative embodiment, the clock recovery circuit of the invention can be implemented with single-ended logic rather than differential logic.

Figure 9:
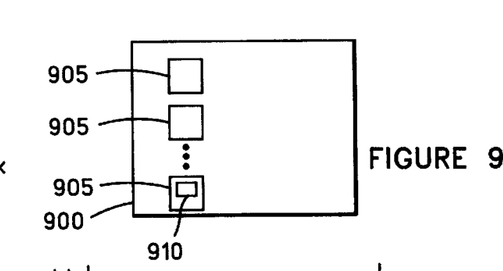
FIG. 9 is a plan view of a CMOS integrated circuit with at least one circuit that includes the high speed clock recovery circuit of FIG. 5.

FIG. 9 illustrates a preferred embodiment of the invention in which the CRC is incorporated into a monolithic integrated circuit (IC) device 900, which includes all of the elements of the CRC 500 shown in FIG. 5, on a substrate of silicon material. The IC 900 includes one or more circuits 905, with at least one of the circuits including a CMOS clock recovery circuit 910 that includes all of the elements of the CRC 500 shown in FIG. 5. Any circuit or circuits 905 that include a CRC 910 preferably include additional circuit elements, but optionally may include only the CRC 910.

Known integrated circuit manufacturing techniques provide for the fabrication of circuit components such as resistors and CMOS transistors, and provide for the fabrication of entire circuits. For example, the CRC 500 has been built in an IC using a 0.35 micron digital CMOS fabrication process.

In an alternative embodiment, the CRC could be assembled with a number of different IC chips and discrete components. For example, the x-or gates could be on one IC, the flip flop and latch could be on another IC, and the op-amp could be on another IC. In this alternative embodiment the resistors and capacitors could be discrete components.

One of the benefits of the CRC 500 is that the entire circuit can be fabricated in an IC, and does not require an external delay line as is used in some prior art clock recovery circuits. Thus, the CRC 500 has lower cost, smaller size, and less manufacturing variations than a clock recovery circuit that uses an external delay line.

Operation

FIG. 7 is an idealized timing diagram that illustrates the operation of the CRC of FIG. 5, but without indicating the effects of propagation delays and other similar delays. For clarity, the inverted signals of each differential signal pair are not shown in FIG. 7, except for the inverted clock, ckby. In the CRC 500 of FIG. 5, data signals di and dbi are inputted into respectively inputs DX and DBX of flip flop 505, and clock signals cky and ckby, are inputted respectively into clock inputs CKY and CKBY, of flip flop 505. Signals a1y and a1by, which are delayed versions of respectively di and dbi, are outputted from respectively outputs QX and QBX of the flip flop.

Signals a1y and a1by are inputted into respectively inputs DX and DBX of the latch 510. Clock signals ckby and cky are inputted into respectively clock inputs CKY and CKBY of the latch 510. Signals a2x and a2bx, which are delayed versions of respectively a1y and a1by, and which are further delayed versions of respectively di and dbi, are outputted from respectively outputs QX and QBX of the latch.

Data signals di and dbi are inputted into respectively first differential inputs DX and DBX of the first x-or gate 515. Signals a1y and a1by from the outputs of the flip flop are inputted into respectively second differential inputs EY and EBY of the first x-or gate.

Signals a1y and a1by from the outputs of the flip flop are inputted into respectively first differential inputs DX and DBX of the second x-or gate 520. Signals a2x and a2bx from the outputs of the latch are inputted into respectively second differential inputs EY and EBY of the second x-or gate.

The signals 1x outputted from the output QX of the first x-or gate 515 are variable width pulses, with the leading edges of the pulses coinciding with each positive and negative transition of data signals di and dbi. The signals 1bx outputted from the output QBX of the first x-or gate are logical inverses of the output signals 1x. The width of each output pulse 1x is determined by the position of the clock pulses cky and ckby relative to the position of the data pulses di and dbi.

The signals 2x outputted from the output QX of the second x-or gate 520 are fixed width pulses having about 50% duty cycles, with the leading edges of the pulses coinciding with the trailing edges of the pulses 1x outputted from the first x-or gate. The signals 2bx outputted from the output QBX of the second x-or gate are logical inverses of the output signals 2x.

As discussed in the background, it is desired to have the transitions of the data pulses di and dbi coincide with respectively the trailing edges of the clock pulses cky and the leading edges of the not-clock pulses ckby. If these edges of the clock pulses are to the left of the transitions of the data, then the clock is advanced relative to the data, as is the case in FIG. 7. When the clock is advanced, the width of the pulses 1x and the inverse pulses 1bx from the outputs of the first x-or gate are reduced to less than a 50% duty cycle, with the extent of the reduction of the widths being proportional to the extent that the clock is advanced relative to the data.

If the trailing edges of the cky pulses and the leading edges of the ckby pulses are to the right of the transitions of the data, then the clock is retarded relative to the data. When the clock is retarded, the width of the pulses 1x and the inverse pulses 1bx from the outputs of the first x-or gate are increased to greater than a 50% duty cycle, with the extent of the increase in the widths being proportional to the extent that the clock signals are retarded relative to the data signals. When the clock signals have the desired alignment with the data signals, the width of the variable width pulses 1x and inverse pulses 1bx from the outputs of the first x-or gate are substantially identical to the width of the fixed width pulses 2x and inverse pulses 2bx from the outputs of the second x-or gate, except for jitter errors.

Output signal 1x from the first x-or gate passes through resistors R1 and R5 and is inputted into the noninverting input 525b of the op-amp 525. Output signal 2x from the second x-or gate passes through resistors R3 and R6 and is inputted into the inverting input 525a of the op-amp. In an alternative embodiment, resistors R1–R4 are not used. Output signal 1bx from the first x-or gate passes through resistors R2 and R6 and is inputted into the inverting input 525a of the op-amp 525. Output signal 2bx from the second x-or gate passes through resistors R4 and R5 and is inputted into the non-inverting input 525b of the op-amp. The output of the op-amp is representative of the difference between the average voltage of signal 1x and the average voltage of signal 2x, and is also representative of the difference between the average voltage of signal 1bx and the average voltage of signal 2bx. The signal at the output of the op-amp is referred to as the difference signal.

The difference signal is inputted into the input 530a of the voltage controlled oscillator (VCO) 530, in order to control the frequency of the output of the VCO. Thus, when the clock is advanced relative to the data, the frequency of the VCO will be temporarily reduced, and when the clock is retarded relative to the data, the frequency of the VCO will be temporarily increased.

The signal at the output of the VCO is inputted into buffer inverter 535, which outputs clock signal cky from output CKY, and outputs not-clock signal ckby from output CKBY. Accordingly, CRC 500 automatically varies the frequency of the VCO in order to establish and maintain the desired alignment between the clock and the data.

Figure 6:
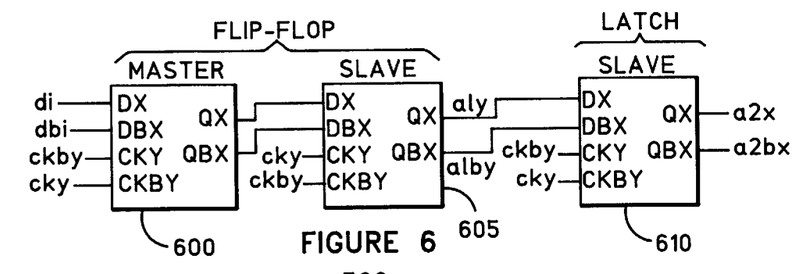
FIG. 6 is a block diagram illustrating the latches of the CMOS high speed clock recovery circuit of FIG. 5.

FIG. 6 is a block diagram of a portion of the CRC 500 of FIG. 5, showing the latches. Referring to FIG. 6 it can be seen that the CRC 500 uses three latches, which are master latch 600, slave latch 605, and slave latch 610, which is also referred to as the second slave latch. Master latch 600 and slave latch 605 together comprise the flip flop. In contrast, it can be seen in FIG. 2 that the prior art circuit 100 uses four latches 200, 205, 210, and 215. A latch corresponding with the second master latch 210 in FIG. 2 is not used in the circuit of FIG. 6. Thus, one less latch is used in the CRC 500 in FIG. 5 than in the circuit 100 in FIG. 1.

An important aspect of the invention is that the CRC 500 properly aligns the clock and the data, but uses only three latches. Using three latches rather than four latches renders several benefits.

One important benefit is that the CRC 500 of FIG. 5 can operate at higher frequencies than the circuit 100 of FIG. 1. As discussed in the background, for the circuit of FIG. 1, the time between when the clock cky goes from low to high and when the not-clock ckby goes from low to high must be a minimum of ck→Q+pd3+Rsetup, and the maximum frequency of operation is approximately ½(ck→Q+pd3+Rsetup). In these equations, ck→Q is the "clock to Q" delay through the first flip flop (which is the combination of the first master latch and the first slave latch), pd3 is the propagation delay through the second master latch, and Rsetup is the required waiting time from the moment that a signal is present at the input to the second slave latch until the signal can be accurately transferred the output of the second slave latch by transition of ckby from low to high.

In contrast, for the CRC 500 of FIG. 5 there is no propagation delay pd3 because there is no second master latch. Accordingly, for the CRC 500 of FIG. 5, the time between when the clock cky goes from low to high and when the not-clock ckby goes from low to high must be a minimum of only about ck→Q+Rsetup, and the maximum frequency of operation is increased to about ½(ck→Q+Rsetup). This benefit is illustrated in FIG. 8.

In FIG. 8, the signals for w2bx2 and a2x with reference to the circuit in FIG. 1 indicate operation at a frequency at which the actual setup time setup4 is equal to the required setup time Rsetup. For example, with a 0.35 micron process, this frequency is about 2.0 GHz. If the frequency is increased, the actual setup time setup4 will become less than the required setup time Rsetup, which could cause errors.

In contrast to the setup time setup4 indicated for the circuit of FIG. 1, the signal shown in FIG. 8 for a2x with reference to the circuit in FIG. 5 indicates a longer actual setup time setup4. The longer actual setup time is the result of the elimination of the propagation delay pd3. As a result of the excess setup time, the frequency of operation of the circuit in FIG. 5 can be increased until the actual setup time setup4 is reduced to the required setup time Rsetup.

Another benefit of not using a second master latch in the CRC 500 is that the clock inputs to the second master latch are eliminated. Thus, the clock signals cky and ckby are each connected to three latches instead of four latches. This reduces the load on the clock signals cky and ckby, which allows higher frequency operation.

Another benefit of not using a second master latch is that the power that would have been consumed by a second master latch is saved, and the heat that would have been produced by a second master latch is eliminated.

While there have been shown what are presently considered to be preferred embodiments of the invention, it will be apparent to those skilled in the art that various changes and modifications can be made herein without departing from the scope of the invention as defined by the appended claims.

What is claimed is:

1. A complementary metal-oxide semiconductor (CMOS) clock recovery circuit for synchronizing a clock with data, comprising:

a master-slave flip-flop having a clock input, a non-clock input, a data input, and an output;

a latch having a data input, a clock input, a non-clock input, and an output, the output of the master-slave flip-flop being connected to the data input of the latch;

a first exclusive-or gate having a first input, a second input, and an output, the data being connected to the first input and the output of the master-slave flip flop being connected to the second input;

a second exclusive-or gate having a first input, a second input, and an output, the output of the master-slave flip flop being connected to the first input and the output of the latch being connected to the second input;

means connected to the output of the first exclusive-or gate and connected to the output of the second exclusive-or gate for producing a difference signal representative of the difference between the average voltage of the output of the first exclusive-or gate and the average voltage of the output of the second exclusive-or gate; and a clock having an input connected to the output of the difference signal producing means, and clock and non-clock outputs connected, respectively, to the clock and non-clock inputs of the master-slave flip flop, wherein the non-clock output is the inversion of the clock output.

2. The CMOS clock recovery circuit of claim 1 wherein the master-slave flip flop has a pair of differential inputs, and wherein the output of the master-slave flip flop is a pair of differential outputs, the data input to the latch is a pair of differential data inputs, the output of the latch is a pair of differential outputs, the first input of the first exclusive-or gate is a first pair of differential inputs and the second input of the first exclusive-or gate is a second pair of differential inputs, the first input of the second exclusive-or gate is a first pair of differential inputs and the second input of the second exclusive-or gate is a second pair of differential inputs, and wherein the differential outputs of the master-slave flip flop are connected to the differential data inputs of the latch and to the second differential inputs of the first exclusive-or gate and to the first differential inputs of the second exclusive-or gate, and wherein the differential outputs of the latch are connected to the second differential inputs of the second exclusive-or gate, and wherein the data is a differential data pair that is connected to the differential inputs of the master-slave flip flop and to the first differential inputs of the first exclusive-or gate.

3. The CMOS clock recovery circuit of claim 1 wherein the difference signal producing means is an operational amplifier connected to the output of the first exclusive-or gate and connected to the output of the second exclusive-or gate for producing a difference signal representative of the difference between the average voltage of the output of the first exclusive-or gate and the average voltage of the output of the second exclusive-or gate.

4. The CMOS clock recovery circuit of claim 1 wherein the first exclusive-or gate output is a pair of differential outputs and wherein the second exclusive-or gate output is a pair of differential outputs, and wherein the difference signal producing means is an operational amplifier connected to the differential outputs of the first exclusive-or gate and connected to the differential outputs of the second exclusive-or gate for producing a difference signal representative of the difference between the average voltage of a first one of the differential outputs of the first exclusive-or gate and the average voltage of a first one of the differential outputs of the second exclusive-or gate and also representative of the difference between the average voltage of a second one of the differential outputs of the first exclusive-or gate and the average voltage of a second one of the differential outputs of the second exclusive-or gate.

5. The CMOS clock recovery circuit of claim 3 wherein the clock is a voltage controlled oscillator (VCO) having an input and an output, and wherein the difference signal is connected to the input of the VCO.

6. The CMOS clock recovery circuit of claim 1 wherein the master-slave flip flop has a pair of differential clock inputs and the latch has a pair of differential clock inputs, and wherein the clock is a differential clock pair connected to the differential clock inputs of the master-slave flip flop, and wherein the differential clock pair is invertedly connected to the differential clock inputs of the latch.

7. The CMOS clock recovery circuit of claim 1 wherein the master-slave flip flop, the latch, the first exclusive-or gate, and the second exclusive-or gate each have a VSS connector and a VDD connector, and wherein a voltage vdd is applied to the VDD connectors, and wherein a voltage vss is applied to the VSS connectors, wherein the difference between the voltage vdd and the voltage vss is about 3.3 volts for a 0.35 micron process.

8. The CMOS clock recovery circuit of claim 1 wherein the frequency of the clock is about 2.7 gigahertz for a 0.35 micron process.

9. A monolithic complementary metal-oxide semiconductor (CMOS) integrated circuit (IC), comprising:

one or more circuits, at least one of the circuits comprising a CMOS clock recovery circuit, the CMOS clock recovery circuit including:

a master-slave flip-flop having a data input, a clock input, a non-clock input, and an output;

a latch having a data input, a clock input, a non-clock input, and an output, the output of the master-slave flip flop being connected to the data input of the latch;

a first exclusive-or gate having a first input, a second input, and an output, the data being connected to the first input and the output of the master-slave flip flop being connected to the second input;

a second exclusive-or gate having a first input, a second input, and an output, the output of the master-slave flip flop being connected to the first input and the output of the latch being connected to the second input;

means connected to the output of the first exclusive-or gate and connected to the output of the second exclusive-or gate for producing a difference signal representative of the difference between the average voltage of the output of the first exclusive-or gate and the average voltage of the output of the second exclusive-or gate; and a clock having an input connected to the difference signal producing means, and clock and non-clock outputs connected, respectively, to the clock and non-clock inputs of the master-slave flip flop, wherein the non-clock output is the inversion of the clock output.

10. The IC device of claim 9 wherein the master-slave flip flop has a pair of differential inputs, and wherein the output of the master-slave flip flop is a pair of differential outputs, the data input to the latch is a pair of differential data inputs, the output of the latch is a pair of differential outputs, the first input of the first exclusive-or gate is a first pair of differential inputs and the second input of the first exclusive-or gate is a second pair of differential inputs, the first input of the second exclusive-or gate is a first pair of differential inputs and the second input of the second exclusive-or gate is a second pair of differential inputs, and wherein the differential outputs of the master-slave flip flop are connected to the differential data inputs of the latch and to the second differential inputs of the first exclusive-or gate and to the first differential inputs of the second exclusive-or gate, and wherein the differential outputs of the latch are connected to the second differential inputs of the second exclusive-or gate, and wherein the data is a differential data pair that is connected to the differential inputs of the master-slave flip flop and to the first differential inputs of the first exclusive-or gate.

11. The IC device of claim 9 wherein the the difference signal producing means is an operational amplifier connected to the output of the first exclusive-or gate and connected to the output of the second exclusive-or gate for producing a difference signal representative of the difference between the average voltage of the output of the first exclusive-or gate and the average voltage of the output of the second exclusive-or gate.

12. The IC device of claim 9 wherein the first exclusive-or gate output is a pair of differential outputs and wherein the second exclusive-or gate output is a pair of differential outputs, and wherein the difference signal producing means is an operational amplifier connected to the differential outputs of the first exclusive-or gate and connected to the differential outputs of the second exclusive-or gate for producing a difference signal representative of the difference between the average voltage of a first one of the differential outputs of the first exclusive-or gate and the average voltage of a first one of the differential outputs of the second exclusive-or gate and also representative of the difference between the average voltage of a second one of the differential outputs of the first exclusive-or gate and the average voltage of a second one of the differential outputs of the second exclusive-or gate.

13. The IC device of claim 11 wherein the clock is a voltage controlled oscillator (VCO) having an input and an output, and wherein the difference signal is connected to the input of the VCO.

14. The IC device of claim 9 wherein the master-slave flip flop has a pair of differential clock inputs and the latch has a pair of differential clock inputs, and wherein the clock is a differential clock pair connected to the differential clock inputs of the master-slave flip flop, and wherein the differential clock pair is invertedly connected to the differential clock inputs of the latch.

15. The IC device of claim 9 wherein the master-slave flip flop, the latch, the first exclusive-or gate, and the second exclusive-or gate each have a VSS connector and a VDD connector, and wherein a voltage vdd is applied to the VDD connectors, and wherein a voltage vss is applied to the VSS connectors, wherein the difference between the voltage vdd and the voltage vss is about 3.3 volts for a 0.35 micron process.

16. The IC device of claim 9 wherein the frequency of the clock is about 2.7 gigahertz for a 35 micron process.

* * * * *